United States Patent [19]

Lendl

[11] 4,176,976

[45] Dec. 4, 1979

[54] MOSAIC PRINTING HEAD

[75] Inventor: Josef Lendl, Ottensoos, Fed. Rep. of Germany

[73] Assignee: Triumph Werke Nurnberg A.G., Nuremberg, Fed. Rep. of Germany

[21] Appl. No.: 887,023

[22] Filed: Mar. 16, 1978

[30] Foreign Application Priority Data

Apr. 15, 1977 [DE] Fed. Rep. of Germany ....... 2716618

[51] Int. Cl.[2] ........................ B41J 3/12; H01L 41/04

[52] U.S. Cl. ................................ 400/124; 101/93.05; 310/328

[58] Field of Search .......................... 101/93.04, 93.05; 310/328; 400/124

[56] References Cited

U.S. PATENT DOCUMENTS

| | | | |
|---|---|---|---|
| 3,754,199 | 8/1973 | Lisinski | 101/93.04 X |
| 3,955,049 | 5/1976 | MacNeil et al. | 178/30 |
| 4,004,671 | 1/1977 | Kondur | 101/93.05 X |
| 4,035,671 | 7/1977 | Schafft | 310/332 |

FOREIGN PATENT DOCUMENTS

| | | | |
|---|---|---|---|
| 681442 | 9/1939 | Fed. Rep. of Germany | 400/124 |
| 1039769 | 9/1958 | Fed. Rep. of Germany | 400/124 |
| 1132158 | 6/1962 | Fed. Rep. of Germany | 400/124 |
| 1254388 | 11/1967 | Fed. Rep. of Germany | 400/124 |
| 1271440 | 6/1968 | Fed. Rep. of Germany | 400/124 |
| 2458809 | 6/1976 | Fed. Rep. of Germany | 400/124 |

*Primary Examiner*—Paul T. Sewell

*Attorney, Agent, or Firm*—Joseph R. Spalla; Brian L. Ribando

[57] ABSTRACT

Printing members comprising a mosaic printing head are driven by flexural bending elements which are electrically actuated to produce a desired printed pattern. The bending elements may take the form of piezoelectric strips or diaphragm pieces which are supported by bearings located at nodal oscillation points of the elements. The printing members when actuated protrude from a bore in one end of a printing head housing. The printing head housing is mounted for transverse movement along guide rails.

5 Claims, 5 Drawing Figures

MOSAIC PRINTING HEAD

BACKGROUND OF THE INVENTION

The invention relates to a mosaic printing head for use in producing a desired printed pattern by selective energization of one or more of a plurality of printing members.

Known prior art methods of printing with a matrix type head are disclosed in the German published specifications No. 1 039 769 of Buser and No. 1 132 158 of Preisinger. In the publication to Buser, an array of magnetostrictive elements is selectively energized in order to produce a desired printed pattern. Preisinger shows a similar construction in which exciter windings are wound around magnetostrictive rods, which rods are caused to elongate, and consequently, to print upon a recording medium due to an excitation signal impressed upon the windings. The German published application No. 24 58 809 of Stecker et al discloses a rolling motion printer in which an array of solenoids having a plunger-like action is made to selectively contact regions of a printing medium in order to produce a mark thereon. German Pat. No. 681 442 of Devaux shows a printing hammer which is actuated by a stack of piezoelectric crystals. The hammer is positioned so as to contact a printing pin to drive an inked ribbon into contact with a printing medium.

The devices of the prior art suffer from the disadvantage of a very small amount of mechanical power being developed by the printing members at the most extended position of a printing stroke. Also, the rapidity of the printing strokes is often too slow, and any bounce or chatter of the member on return to the rest position further slows overall operation.

SUMMARY AND OBJECTS OF THE INVENTION

Each of an array of printing members which comprise a mosaic printing head is attached to a flexural bending element. When selectively energized, the bending elements thrust the printing members forward and a desired printed pattern may be produced. The bending elements are supported by bearings which contact the elements in nodal regions which are not displaced during flexure. Excitation signals having frequencies which are equal or nearly equal to the resonant frequency of the bending elements are used, and when excited, the end printing members protrude from one end of a housing which comprises the mosaic printing head. The housing is mounted by means of guides to transverse rails to allow traverse of a record carrier as required.

It is therefore an object of the invention to provide a mosaic printing head comprising a plurality of printing members which are actuated by bending elements.

It is another object of the invention to provide a mosaic printing head comprising an array of reciprocating printing members which are driven by flexural bending elements in a selected sequence to produce a desired printed pattern.

It is yet another object of the invention to provide a mosaic printing head comprising a movable housing in which is mounted a plurality of printing members and an array of bending elements which operate in a flexural mode to drive the printing members to a record carrier in order to print a desired pattern thereon.

These and other objects of the invention will become apparent from the following detailed description taken in conjunction with the accompanying drawing figures in which like reference numerals designate like or corresponding parts through the figures.

DESCRIPTION OF THE PREFERRED EMBODIMENT

Figure 1:
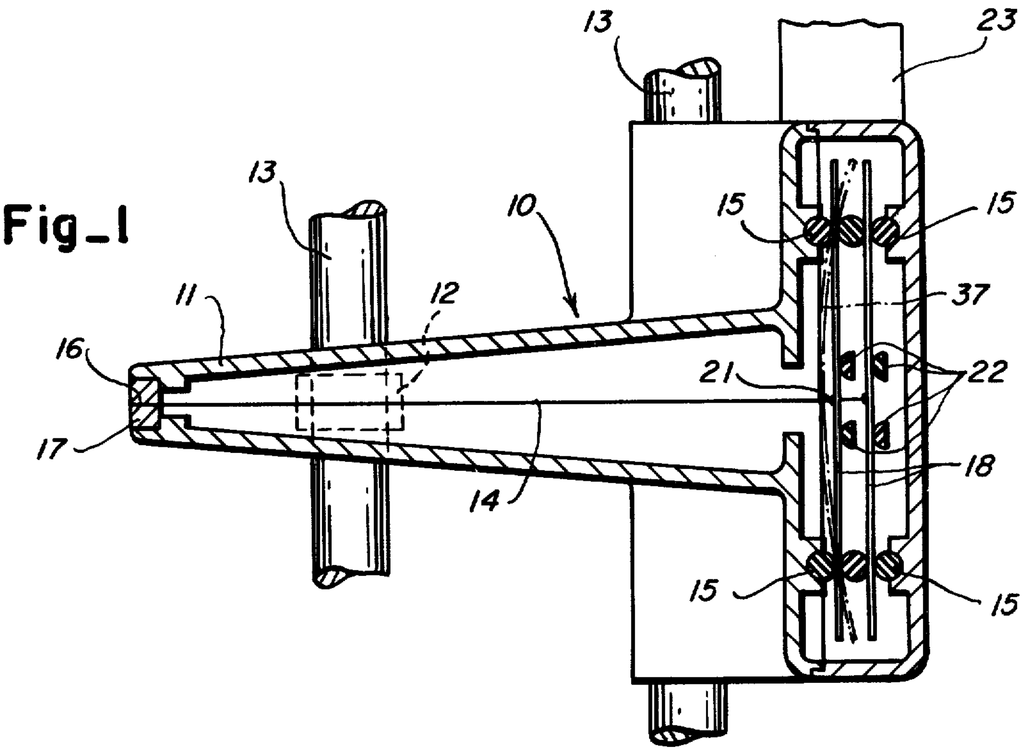
FIG. 1 is a plan view of a mosaic printing head according to the invention.

Referring now to the drawings, there is shown in FIG. 1 a mosaic printing head generally designated by the reference numeral 10. The printing head comprises a housing 11 which is slidably mounted by means of guides 12 to a pair of parallel rails 13. The interior of the housing 11 includes a plurality of elongated printing members 14 only one of which appears in the Figure. The printing members 14 may take the form of any stiff and rigid member such as a wire or a needle. The printing members 14 extend from a bore 16 formed in a front piece 17 of the housing 11 to a selected one of a plurality of bending elements 18. The bore 16 may be one which accommodates the plurality of printing members 14 or may comprise a plurality of apertures in a vertical array through each of which one of the printing members passes. Each of the bending elements 18 may comprise piezoelectric strips and may be mounted by means of bearing pivots 15 which contact the bending elements on nodal points thereof. The nodal point support allows the elements 18 to flex into a curved shape with the nodal points remaining in a fixed position within the housing 11.

The printing members 14 are attached as at 21 to the bending elements 18 by means of a small amount of glue or solder or the like. A plurality of elastic stops 22 are provided on one side of each of the elements to contact the bending elements when the same are in a rest position, as shown. A plurality of leads comprising a multiconductor cable 23 or the like is attached to and carried by the housing 11 and provides the proper electrical interconnection between the housing 11 and a means for supplying energizing pulses to the selected bending elements. The said pulse supplying means is not shown in the drawing, and it will be understood by those skilled in the art that individual leads which comprise the multiconductor cable 23 are attached to the bending elements 18 to enable energization thereof.

Figure 2:
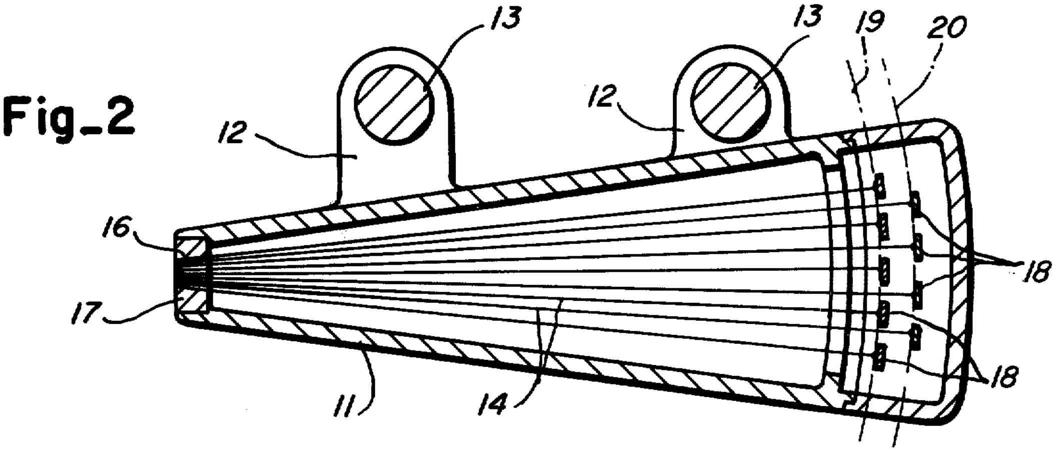
FIG. 2 is a side view of the mosaic printing head of FIG. 1.

Turning now to FIG. 2, it will be seen that the plurality of the bending elements 18 are positioned one above the other in two spaced arcs 19 and 20. The positioning of these elements 18 along the arc 19 is such that the printing members 14 which are driven by the elements 18 located in the arc 20 pass therebetween. All of the printing members 14 comprise an array which is focused onto the bore 16 in the front piece 17.

Figure 3:
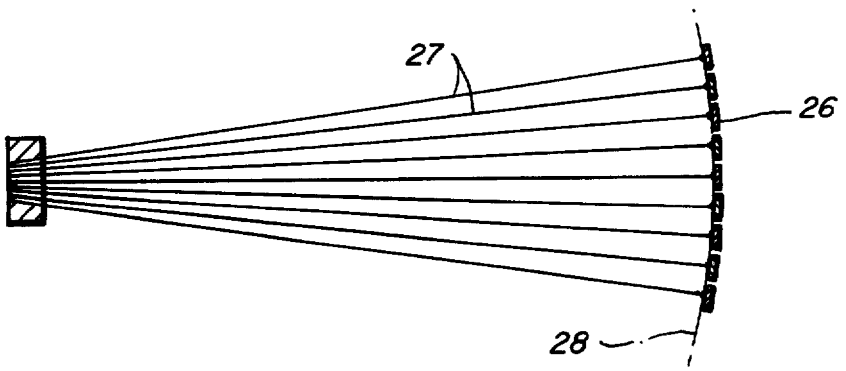
FIG. 3 is a side view of an alternative arrangement of printing members.

Turning now to FIG. 3, an alternative arrangement of bending elements 26 and printing members 27 is shown. According to this arrangement, the elements 26 all lie along a common arc 28. It will be appreciated that the elements 26, as well as the elements 18, shown in FIGS. 1 and 2 comprise elongated flat strips of material. For purposes of clarity, the nodal supports and elastic stops have not been shown in FIGS. 2 and 3.

Figure 4:
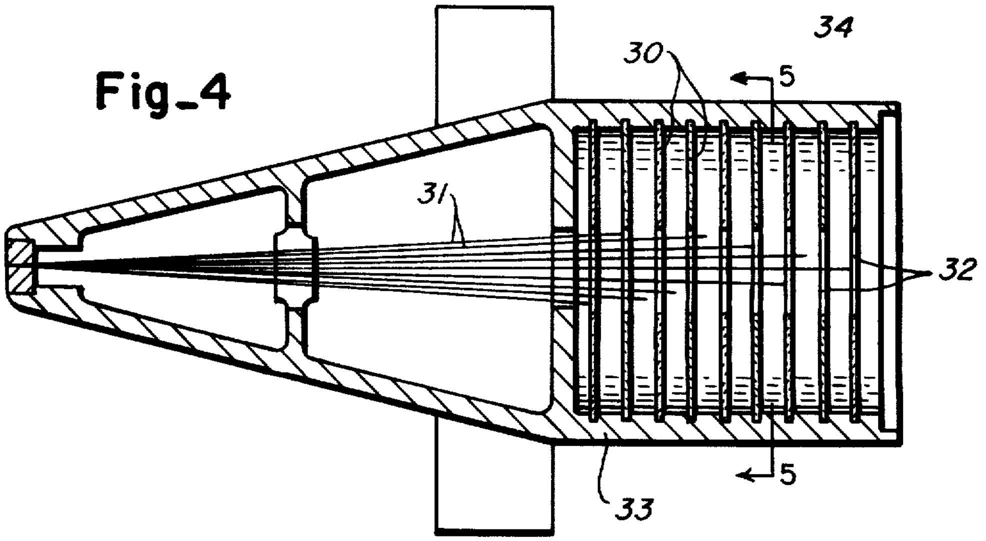
FIG. 4 is a plan view of an alternative form of a mosaic printing head.
Figure 5:
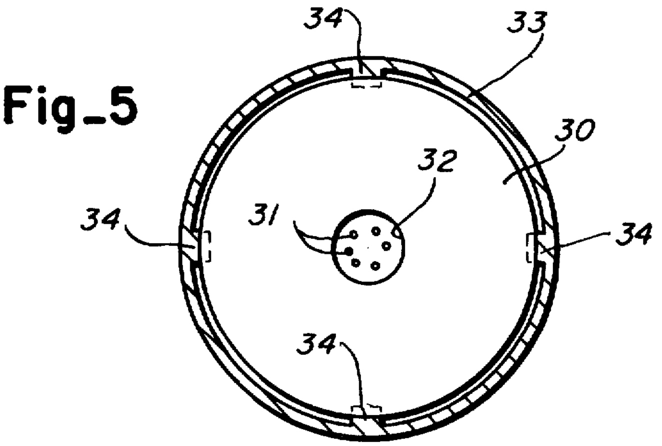
FIG. 5 is a sectional view taken along lines 5--5 of FIG. 4.

Turning now to FIGS. 4 and 5, another alternative arrangement of a matrix printing head is shown. According to the invention, a plurality of disc-shaped diaphragm drivers 30 are provided. The drivers 30 may comprise piezoelectric material and near the middle region of each is connected an end of one of an array of printing elements 31. Each of the diaphragm drivers 30 is provided with a central through passage or bore 32 to allow passage of the printing elements 31 therethrough. For the sake of accuracy in the drawing, attachment of all of the printing elements 31 to the diaphragm drivers 30 is not shown since consonant with the sectional view of FIG. 5, some of the elements 31 must be broken. Attachment of the several diaphragm drivers 30 to the housing 33 is made by means of lugs 34 formed at spaced locations on the interior thereof. The lugs 34 are attached to nodal points of the drivers 30.

The operation of the device will be apparent to those skilled in the art. First, with respect to the embodiments shown in FIGS. 1, 2, or 3, application of a voltage to a selected one of the bending elements 18 or 26 causes the middle portion of the said element to flex toward the front piece 17 of the housing as shown in phantom in FIG. 1 at 37 in a manner which is well known in the art. This flexure advances the printing member 14 in the direction of the front piece 17 and causes the end of the advanced member to protrude from the bore 16 and impinge upon a recording transfer medium in order to effect the printing on a record carrier, not shown. A selective energization of one or more of the bending elements 18 will cause printing in any desired pattern to be effected on a record carrier. The provision of the elastic stops 22 prevents chatter or backlash when the elements 18 return to an initial rest position and allow an element 14 to be repeatedly cycled if desired at a high printing rate. The bending elements may comprise two layers of piezoelectric material which are laminated together with electrodes on each side thereof to allow the application of excitation signals thereto. It is also known to apply electrodes in a pattern to a single layer of piezoelectric material in order to flex the same with an excitation signal.

As printing is accomplished, the housing 11 enclosing the array of printing members may be caused to traverse the record carrier so that a desired sequence of patterns can be placed in a line upon the carrier. The traversal is caused by motive means, not shown, which allows the housing 11 to advance along the parallel rails 13. Of course, other means may be substituted for the guides 12 and rails 13 and a similar sequential printing result obtained. For instance, the housing itself could be mounted on a moving carrier, or in the alternative, the record carrier could be made movable while the housing remained fixed.

With respect to FIGS. 4 and 5 of the invention, the principal of operation remains the same as that described above. Because the bending elements 30 are disc shaped and are located one behind the other within the housing 36, each element 30 includes the central aperture 32 so that the printing members may pass therethrough.

Having thus described the invention, various modifications and alterations will occur to those skilled in the art, which modifications and alterations are intended to be within the scope of the present invention as defined in the appended claims.

I claim:

1. In a mosaic printing head for use in forming a printed pattern on a record carrier, the combination comprising:
   - a housing having a bore in a first end thereof,
   - a plurality of elongated strip shaped piezoelectric driving elements mounted in a second end of said housing, said piezoelectric driving elements exhibiting flexure upon application of an excitation signal thereto,
   - mounting means for said driving elements, said mounting means being fixed relative to said housing and contacting said elements on spaced nodal points thereof, and
   - an array of printing members supported in said housing and extending from said first end to said second end, each of said printing members being attached to a middle portion of one of said driving elements between the spaced nodal points thereof.

2. The device of claim 1 further comprising:
   - elastic stop means located on one side of each of said driving elements for contacting said element when the same returns from a flexed to a rest position and for preventing chatter thereof.

3. The device of claim 2 wherein said driving elements are positioned along a plurality of spaced arcs, the elements of one arc being staggered with respect to the remaining elements.

4. The device of claim 3 further comprising:
   - guide means mounted on said housing for supporting said housing, and
   - rail means for supporting said guide means, said guide means being slidable along the rail means.

5. In a mosaic printing head for use in forming a printed pattern on a record carrier, the combination comprising:
   - a housing having a bore in a first end thereof,
   - rail means for supporting said housing,
   - guide means mounted on said housing for securing the same to said rail means,
   - a plurality of strip shaped elongated piezoelectric flexural driving elements mounted in a second end of said housing,
   - an array of printing members attached directly to said driving elements and extending from a middle portion thereof to said bore, and
   - nodal point support means fixed in said housing for supporting said driving elements at nodal points thereof in said housing.

* * * * *